United States Patent
Kwack et al.

(10) Patent No.: US 9,136,502 B2
(45) Date of Patent: Sep. 15, 2015

(54) ORGANIC LIGHT EMITTING DIODE DISPLAY

(75) Inventors: Jin-Ho Kwack, Yongin (KR); Dong-Won Han, Yongin (KR); Kyu-Sung Lee, Yongin (KR)

(73) Assignee: Samsung Display Co., Ltd., Yongin Gyeonggi-do (KR)

( * ) Notice: Subject to any disclaimer, the term of this patent is extended or adjusted under 35 U.S.C. 154(b) by 546 days.

(21) Appl. No.: 12/702,936

(22) Filed: Feb. 9, 2010

(65) Prior Publication Data

US 2010/0200846 A1    Aug. 12, 2010

(30) Foreign Application Priority Data

Feb. 9, 2009    (KR) .................. 10-2009-0010100

(51) Int. Cl.
*H01L 29/08* (2006.01)
*H01L 51/52* (2006.01)
*H01L 27/32* (2006.01)

(52) U.S. Cl.
CPC ......... *H01L 51/5253* (2013.01); *H01L 27/3246* (2013.01)

(58) Field of Classification Search
CPC .................. H01L 27/3246; H01L 51/5253
USPC .............................. 257/79–103, 40
See application file for complete search history.

(56) References Cited

U.S. PATENT DOCUMENTS

| | | | |
|---|---|---|---|
| 2002/0027229 A1* | 3/2002 | Yamazaki et al. | 257/84 |
| 2005/0206309 A1* | 9/2005 | Shibasaki et al. | 313/504 |
| 2006/0170341 A1* | 8/2006 | Su et al. | 313/512 |
| 2007/0146246 A1* | 6/2007 | Nakamura et al. | 345/76 |
| 2007/0172971 A1* | 7/2007 | Boroson | 438/26 |
| 2009/0001877 A1* | 1/2009 | Park et al. | 313/504 |
| 2009/0011550 A1* | 1/2009 | Jeoung et al. | 438/155 |
| 2009/0174322 A1* | 7/2009 | Chan et al. | 313/504 |
| 2009/0278454 A1* | 11/2009 | Fedorovskaya et al. | 313/512 |
| 2010/0294024 A1* | 11/2010 | Kumar et al. | 73/38 |

FOREIGN PATENT DOCUMENTS

| | | |
|---|---|---|
| JP | 2003-178885 A | 6/2003 |
| KR | 10-2006-0000747 A | 1/2006 |
| WO | WO 2008082362 A1 * | 7/2008 |
| WO | WO 2009082061 A1 * | 7/2009 |

* cited by examiner

*Primary Examiner* — H Tsai
(74) *Attorney, Agent, or Firm* — Knobbe, Martens, Olson & Bear, LLP

(57) ABSTRACT

An organic light emitting diode display includes a substrate having organic light emitting diodes thereon. A thin film encapsulation layer is formed on the substrate such that the thin film encapsulation layer covers the organic light emitting diodes. A nonorganic layer is formed under the thin film encapsulation layer along the edge of the thin film encapsulation layer.

18 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2009-0010100 filed in the Korean Intellectual Property Office on Feb. 9, 2009, the entire contents of which are incorporated herein by reference.

BACKGROUND OF THE INVENTION

1. Field of the Invention

The present embodiments relate to an organic light emitting diode display, and more particularly, to an organic light emitting diode display having a thin film encapsulation (TFE) structure.

2. Description of the Related Art

An organic light emitting diode (OLED) display has a plurality of organic light emitting diodes each with a hole injection electrode, an organic emissive layer, and an electron injection electrode. With the organic light emitting diode display, electrons and holes are combined with each other in the organic emissive layer to thereby generate excitons. When the excitons shift from the excited state to the ground state, energy is generated so as to emit light, and images are displayed on the basis of the emitted light.

Accordingly, the organic light emitting diode display involves an emissive or self-luminance characteristic, and differs from a liquid crystal display (LCD) in that it does not require a separate light source such that it has reduced thickness and weight. Furthermore, as the organic light emitting diode display has high quality characteristics such as lower power consumption, high luminance, and short response time, it has been spotlighted as a next generation display device.

However, an organic light emitting diode may be deteriorated due to internal and external factors. With the internal factors, the organic emissive layer is deteriorated under the atmosphere of oxygen from indium tin oxide (ITO) being the electrode material, or under the interfacial reaction between organic layer components of the organic emissive layer. The external factors include external moisture and oxygen, and ultraviolet rays. As the external oxygen and moisture seriously influence the life span of the organic light emitting diode, it is very important to package the organic light emitting diode such that it is sealed from the outside in a vacuum-tight manner.

A thin film encapsulation (TFE) technique may be introduced in packaging the organic light emitting diode. With the thin film encapsulation technique, one or more of inorganic and organic layers are alternately deposited on the organic light emitting diodes formed at the display area of the substrate, thereby covering the display area with a thin film encapsulation layer. With the organic light emitting diode display with such a thin film encapsulation layer, if the substrate comprises a flexible film, it can be bent easily, and is advantageous in forming a slim structure.

As an organic layer (for example, a pixel definition layer) is commonly formed external to the display area with a predetermined width, the thin film encapsulation layer contacts the organic layer at the edge thereof. In this case, the external moisture and oxygen may intrude into the thin film encapsulation layer along the organic layer. Consequently, during the process of driving the organic light emitting diode display, the organic light emitting diodes placed at the edge of the display area are deteriorated so that display failures may occur.

The above information disclosed in this Background section is only for enhancement of understanding of the background of the embodiments and therefore it may contain information that does not form the prior art that is already known in this country to a person of ordinary skill in the art. The present embodiments overcome the above disadvantages as well as provide additional advantages.

SUMMARY OF CERTAIN INVENTIVE ASPECTS

The present embodiments provide an organic light emitting diode display having advantages of preventing external moisture and oxygen from intruding into the thin film encapsulation layer and deteriorating the organic light emitting diodes.

An exemplary embodiment provides an organic light emitting diode display including a substrate having organic light emitting diodes thereon. A thin film encapsulation layer is formed on the substrate such that it covers the organic light emitting diodes. A nonorganic layer is formed under the thin film encapsulation layer along the edge thereof.

The substrate may have a display area with the organic light emitting diodes, and the nonorganic layer may be placed external to the display area. The organic light emitting diode display may further include a pixel definition layer placed external to the display area, and the nonorganic layer may be formed on the pixel definition layer.

The nonorganic layer may be formed with a layer selected from a metallic layer and an inorganic layer.

The nonorganic layer may contain a material selected from Al, Cu, Mo, Ti, ITO, silicon oxide, silicon nitride, aluminum oxide, and silicon oxynitride.

The nonorganic layer may be formed on the same plane as any one of a plurality of layers constructing the display area with the same material.

The organic light emitting diode display may further include an inorganic passivation layer covering the organic light emitting diodes, and the nonorganic layer may be formed with the same material as the material for the inorganic passivation layer. In this case, the nonorganic layer may be formed with a single-layered structure comprising silicon oxide or silicon nitride, or a double-layered structure comprising silicon oxide and silicon nitride.

The organic light emitting diodes each may include a first pixel electrode, an organic emissive layer, and a second pixel electrode.

The nonorganic layer may be formed with the same material as the material for the second pixel electrode. If the organic light emitting diode display is formed as a front emission type, the nonorganic layer may contain a material selected from ITO, IZO, ZnO, and $In_2O_3$. By contrast, if the organic light emitting diode display is formed as a rear emission type, the nonorganic layer may contain a material selected from Al, an Al alloy, Ag, an Ag alloy, Au, and an Au alloy.

The nonorganic layer may be formed with the same material as the material for the first pixel electrode. If the organic light emitting diode display is formed as a front emission type, the nonorganic layer may be formed with a material selected from Al, an Al alloy, Ag, an Ag alloy, Au, and an Au alloy. By contrast, if the organic light emitting diode display is formed as a rear emission type, the nonorganic layer may be formed with a material selected from ITO, IZO, ZnO, and $In_2O_3$.

The organic light emitting diode display may further include driving transistors for driving the organic light emitting diodes. The driving transistors each may include a gate electrode, an interlayer insulating layer formed on the gate electrode, and source and drain electrodes formed on the interlayer insulating layer.

The nonorganic layer may be formed with the same material as the material for the source and drain electrodes. In this case, the nonorganic layer may be formed with a material selected from Ti, a Ti alloy, Ta, and a Ta alloy. The nonorganic layer may be formed with the same material as the material for the interlayer insulating layer. In this case, the nonorganic layer may be formed with a single-layered structure comprising silicon oxide or silicon nitride, or a double-layered structure comprising silicon oxide and silicon nitride.

With an organic light emitting diode display according to an embodiment, the thin film encapsulation layer contacts the nonorganic layer at the edge thereof, thereby effectively preventing the external moisture and oxygen from intruding into the thin film encapsulation layer along the edge of the thin film encapsulation layer. Accordingly, the organic light emitting diodes are prevented from being deteriorated so that the display failures can be reduced, and the durability and the life span of the display can be enhanced.

DETAILED DESCRIPTION OF THE EMBODIMENTS

The present embodiments will be described more fully hereinafter with reference to the accompanying drawings, in which exemplary embodiments are shown. As those skilled in the art would realize, the described embodiments may be modified in various different ways, all without departing from the spirit or scope of the present embodiments.

Figure 1:
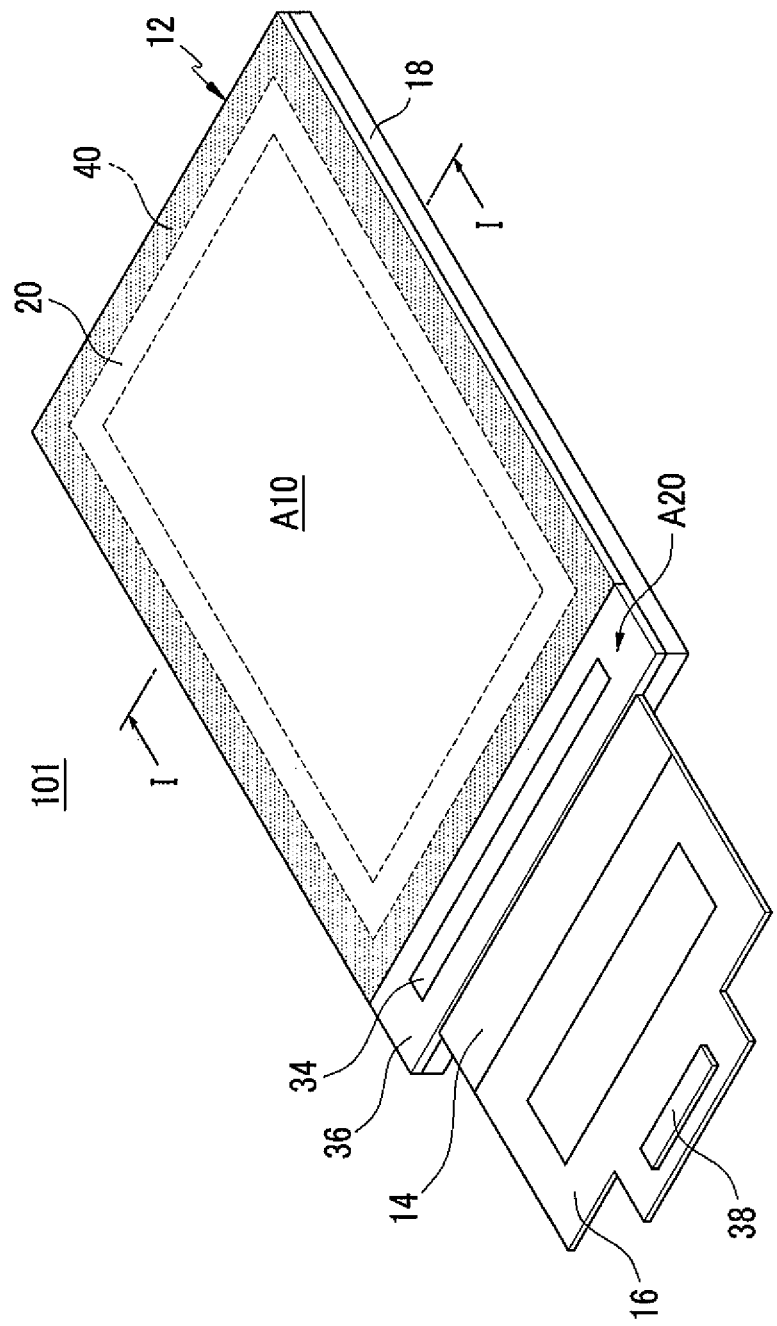
FIG. 1 is a perspective view of an organic light emitting diode display according to a first exemplary embodiment.
Figure 2:
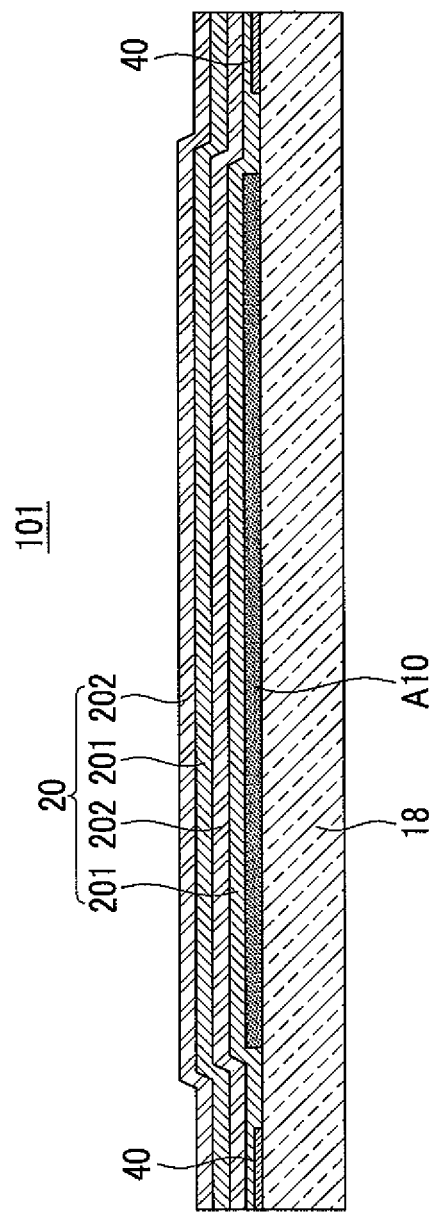
FIG. 2 is a cross-sectional view of the organic light emitting diode display taken along the I-I line of FIG. 1.

FIG. 1 is a perspective view of an organic light emitting diode display according to a first exemplary embodiment, and FIG. 2 is a cross-sectional view of the organic light emitting diode display taken along the I-I line of FIG. 1.

Referring to FIG. 1 and FIG. 2, an organic light emitting diode display 101 according to the present exemplary embodiment includes a panel assembly 12 having a display area A10 and a pad area A20 and displaying a predetermined image at the display area A10, and a printed circuit board 16 electrically connected to the panel assembly 12 via a flexible circuit board 14.

The panel assembly 12 includes a substrate 18 on the top surface of which the display area A10 and the pad area A20 are defined, and a thin film encapsulation layer 20 formed on the substrate 18 such that it covers the display area A10. The thin film encapsulation layer 20 is greater in area than the display area A10, and covers the display area A10 and the top surface of the substrate 18 external to the display area A10 to protect them. The pad area A20 may not be covered by the thin film encapsulation layer 20, and can exposed to the outside.

The sub-pixels are arranged at the display area A10 of the substrate 18 in the form of a matrix, and a scan driver (not shown) and a data driver (not shown) are placed external to the display area A10 in order to drive the sub-pixels. Pad electrodes (not shown) are located at the pad area A20 of the substrate 18 to transmit electrical signals to the scan driver and the data driver.

Figure 3:
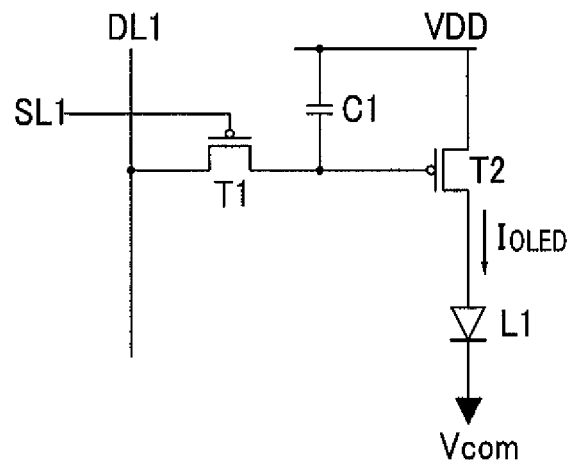
FIG. 3 is a schematic diagram of a sub-pixel circuit structure of the panel assembly shown in FIG. 1.
Figure 4:
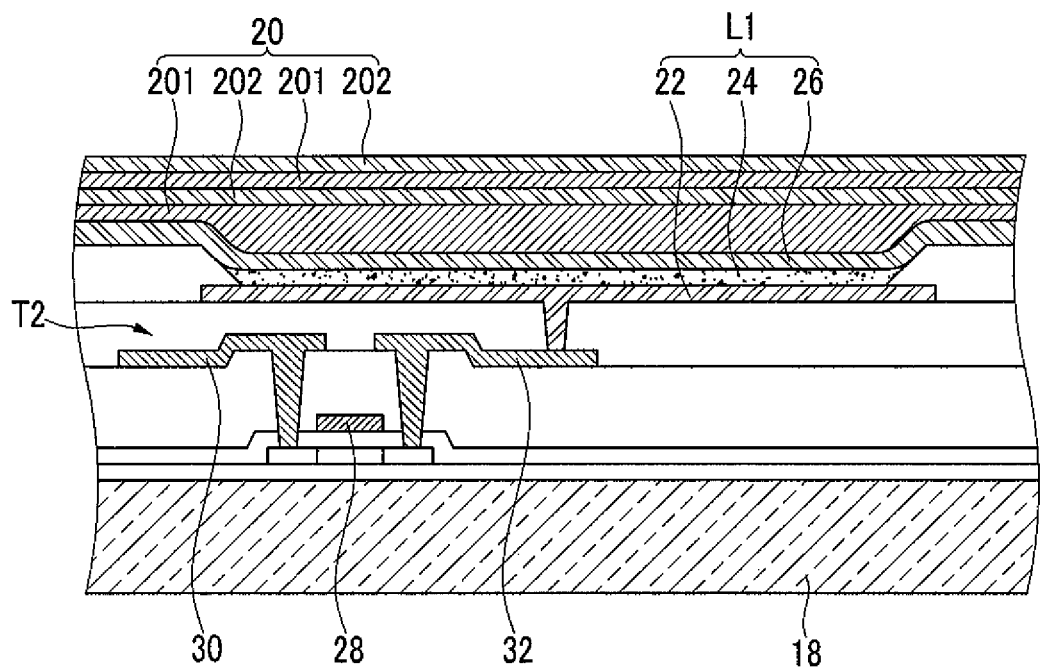
FIG. 4 and FIG. 5 are partial amplified sectional views of the panel assembly shown in FIG. 1.

FIG. 3 is a schematic diagram of a sub-pixel circuit structure of the panel assembly shown in FIG. 1, and FIG. 4 is a partial amplified sectional view of the panel assembly shown in FIG. 1.

Referring to FIG. 3 and FIG. 4, the sub-pixel of the panel assembly 12 (See FIG. 1) comprises an organic light emitting diode L1, and a driving circuit unit. The organic light emitting diode L1 includes a first pixel electrode (or a hole injection electrode) 22, an organic emissive layer 24, and a second pixel electrode (or an electron injection electrode) 26.

The organic emissive layer 24 may include an emission layer (not shown) for emitting light, and in addition, organic layers (not shown) for effectively transferring the carriers of holes or electrons to the emission layer. The organic layers may include a hole injection layer (HIL) and/or a hole transport layer (HTL) interposed between the first pixel electrode 22 and the emission layer, and an electron injection layer (EIL) and an electron transport layer (ETL) interposed between the second pixel electrode 26 and the emission layer.

The driving circuit unit includes at least two thin film transistors T1 and T2, and at least one storage capacitor C1. The thin film transistor includes a switching transistor T1 and a driving transistor T2.

The switching transistor T1 is connected to the scan line SL1 and the data line DL1, and transmits the data voltages input into the data line DL1 to the driving transistor T2 in accordance with the switching voltages input into the scan line SL1. The storage capacitor C1 is connected to the switching transistor T1 and the power supply line VDD, and stores a voltage with a value corresponding to a difference between the voltage transmitted from the switching transistor T1 and the voltage fed to the power supply line VDD.

The driving transistor T2 is connected to the power supply line VDD and the storage capacitor C1 to supply an output current $I_{OLED}$ that is substantially proportional to the square of the difference between the voltage stored at the storage capacitor C1 and the threshold voltage to the organic light emitting diode L1. The organic light emitting diode L1 emits light by way of the output current $I_{OLED}$. The driving transistor T2 includes a gate electrode 28, a source electrode 30, and a drain electrode 32. The first pixel electrode 22 of the organic light emitting diode L1 may be connected to the drain electrode 32 of the driving transistor T2. The structure of the sub-pixel is not limited to as above-described, but may be altered in various manners.

Referring to FIG. 2 and FIG. 4, the thin film encapsulation layer 20 is directly formed on the organic light emitting diodes and the driving circuit units of the substrate 18 so as to seal and protect them from the outside.

The thin film encapsulation layer 20 comprises two or more inorganic layers 201 and two or more organic layers 202, which are alternately deposited one by one. FIG. 2 and FIG. 4 illustrate a case where two inorganic layers 201 and two organic layers 202 are alternately deposited one by one so as to form the thin film encapsulation layer 20.

The inorganic layer 201 may be formed, for example, with aluminum oxide, silicon oxide and the like or a combination, and the organic layer 202 may be formed for example, with at least one of epoxy, acrylate, and urethane acrylate. The inorganic layer 201 prevents intrusion of external moisture and oxygen, and the organic layer 202 relieves the internal stress of the inorganic layer 201 and/or fills the micro-cracks and pin holes of the inorganic layer 201.

Referring to FIG. 1 and FIG. 2, an integrated circuit chip 34 is mounted on the pad area A20 of the panel assembly 12, for example, by way of a chip-on-glass, and a flexible circuit board 14 is mounted thereon, for example, by way of a chip-on-film. A protective layer 36 is formed around the integrated circuit chip 34 and the flexible circuit board 14 so as to cover and protect the pad electrodes formed at the pad area A20. Electronic devices (not shown) can be mounted on the printed circuit board 16 to process the driving signals, and a connector can be installed thereon to transmit the external signals to the printed circuit board 16.

A shock absorbing tape (not shown) or bezel (not shown) may be provided at the backside of the panel assembly 12 to heighten the impact resistance of the panel assembly 12. The flexible circuit board 14 is folded to the backside of the panel assembly 12 such that the printed circuit board 16 faces the rear surface of the panel assembly 12.

With the present exemplary embodiment, the thin film encapsulation layer 20 contacts a nonorganic layer along the edge thereof, not the organic layer. For this purpose, a nonorganic layer 40 is formed under the thin film encapsulation layer 20 along the edge of the thin film encapsulation layer 20 so as to prevent external moisture and oxygen from intruding into the thin film encapsulation layer 20. The nonorganic layer 40 is formed such that it surrounds the display area A10 while being placed external to the display area A10. The nonorganic layer 40 may be spaced apart from the display area A10 by a predetermined distance.

The nonorganic layer 40 may be formed through conducting additional film formation steps before the formation of the thin film encapsulation layer 20 after the driving circuit units and the organic light emitting diodes are formed on the display area A10 of the substrate 18.

Figure 5:
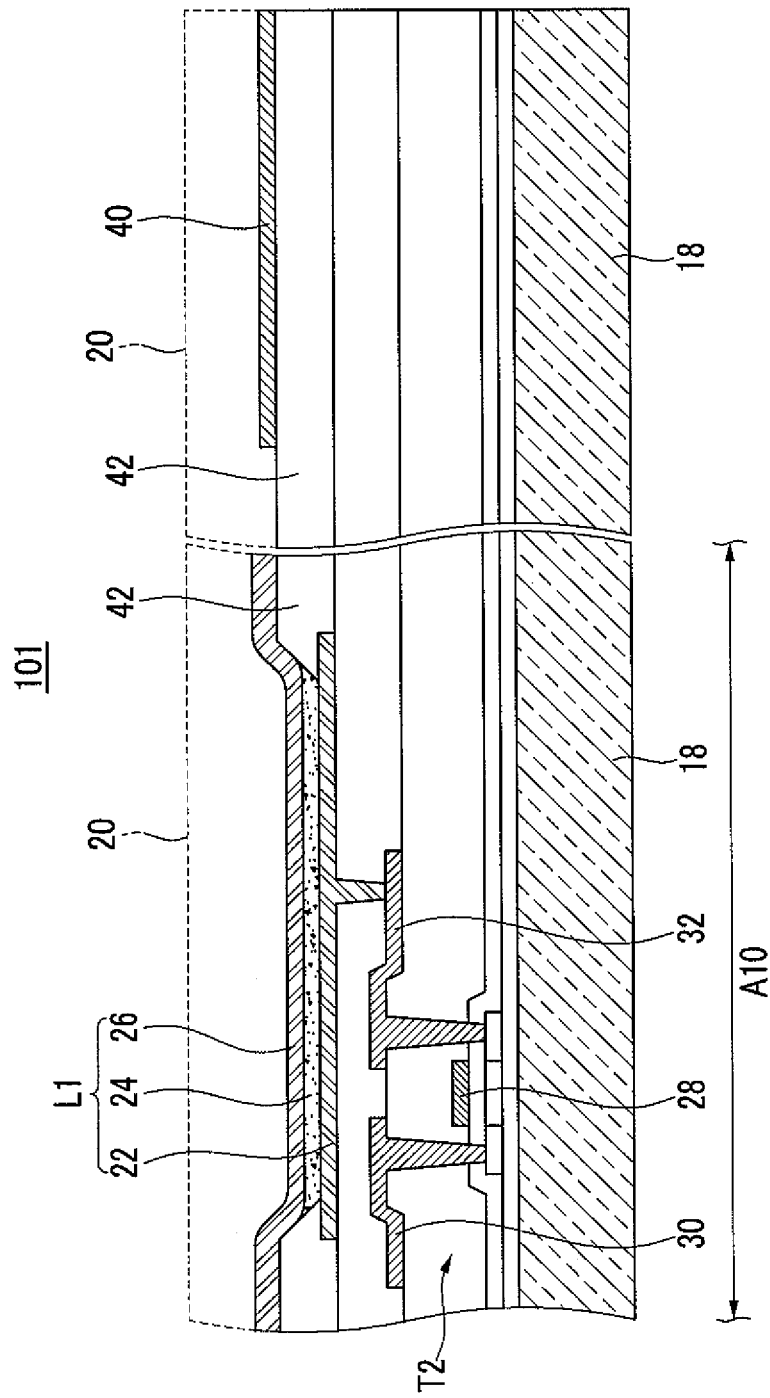

FIG. 5 is a partial amplified sectional view of the panel assembly shown in FIG. 1.

Referring to FIG. 5, a pixel definition layer 42 may be formed external to the display area A10 so as to define the sub-pixels. However, as the pixel definition layer 42 is usually formed with an organic material, the nonorganic layer 40 may be formed on the pixel definition layer 42.

The nonorganic layer 40 may be formed with at least one of a metallic layer and an inorganic layer. The metallic layer may contain, for example, Al, Cu, Mo, Ti, or indium tin oxide (ITO), etc. The inorganic layer may contain, for example, silicon oxide, silicon nitride, aluminum oxide, or silicon oxynitride. The metallic layer may be formed through sputtering or deposition, and the inorganic layer may be formed through sputtering, chemical vapor deposition, or ion beam deposition.

As the thin film encapsulation layer 20 contacts the nonorganic layer 40 along the edge thereof while not contacting the organic layer, the organic light emitting diode display 101 according to the present exemplary embodiment effectively prevents the external moisture and oxygen from intruding into the thin film encapsulation layer 20 along the edge of the thin film encapsulation layer 20. Accordingly, with the organic light emitting diode display 101 according to the present exemplary embodiment, the deterioration of the organic light emitting diodes and the display failures due thereto can be prevented.

The nonorganic layer 40 may be formed with the same material as any of the plurality of layers constructing the display area A10, and can be patterned simultaneously with that layer during the formation of the display area A10.

Figure 6:
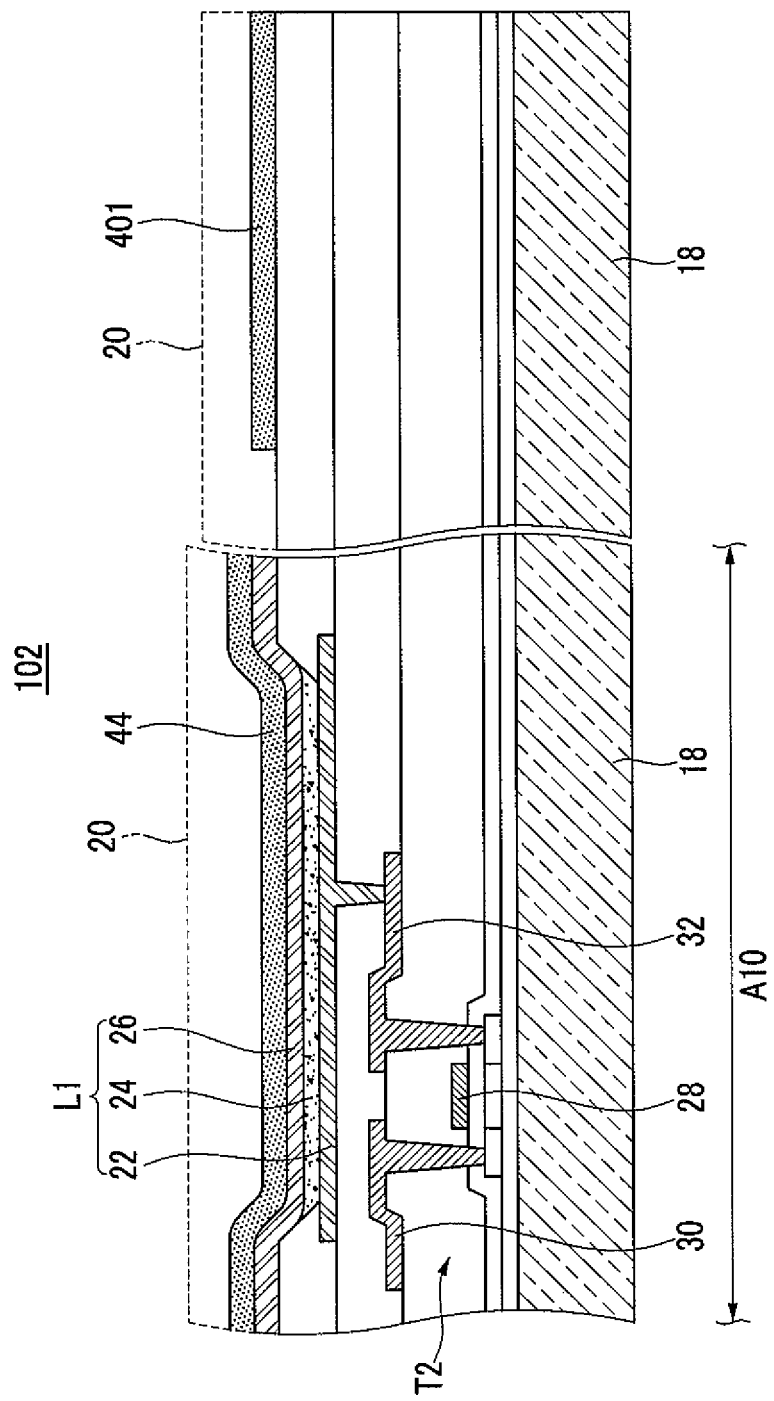
FIG. 6 is a partial amplified sectional view of an organic light emitting diode display according to a second exemplary embodiment.

FIG. 6 is a partial amplified sectional view of an organic light emitting diode display according to a second exemplary embodiment.

Referring to FIG. 6, an organic light emitting diode display 102 according to the present exemplary embodiment has the same structure as that of the organic light emitting diode display according to the first exemplary embodiment except that it further includes an inorganic passivation layer 44 covering the organic light emitting diodes L1 at the entire display area A10, and a nonorganic layer 401 is formed on the same plane as the inorganic passivation layer 44 with the same material. Like reference numerals will be used to designate the same members as those related to the first exemplary embodiment.

When pin holes are generated at the second pixel electrode 26, the inorganic passivation layer 44 covers the pin holes so as to prevent dark spot failures induced by the pin holes. The inorganic passivation layer 44 and the nonorganic layer 401 may be formed with a single-layered structure comprising silicon oxide or silicon nitride, or a double-layered structure comprising silicon oxide and silicon nitride.

Figure 7:
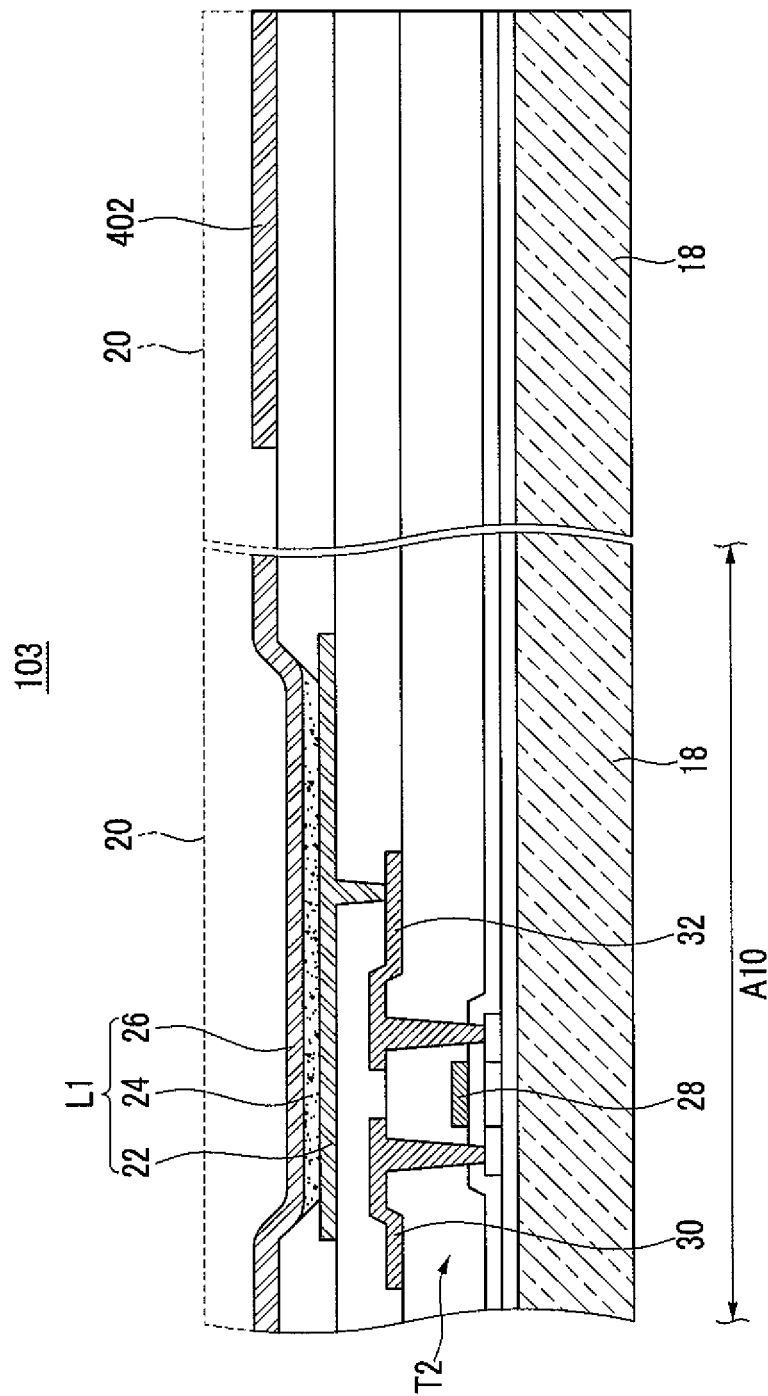
FIG. 7 is a partial amplified sectional view of an organic light emitting diode display according to a third exemplary embodiment.

FIG. 7 is a partial amplified sectional view of an organic light emitting diode display according to a third exemplary embodiment.

Referring to FIG. 7, an organic light emitting diode display 103 according to the present exemplary embodiment has the same structure as that of the organic light emitting diode display according to the first exemplary embodiment except that a nonorganic layer 402 is formed on the same plane as the second pixel electrode 26 with the same material. Like reference numerals will be used to designate the same members as those related to the first exemplary embodiment.

If the organic light emitting diode display 103 is formed as a front emission type, the second pixel electrode 26 and the nonorganic layer 402 may be formed with a transparent conductive layer, which contains, for example, indium tin oxide (ITO), indium zinc oxide (IZO), ZnO, or $In_2O_3$. If the organic light emitting diode display 103 is formed as a rear emission type, the second pixel electrode 26 and the nonorganic layer 402 may be formed with a photo-reflective metallic layer, for example, Al, an Al alloy, Ag, an Ag alloy, Au, or an Au alloy.

Figure 8:
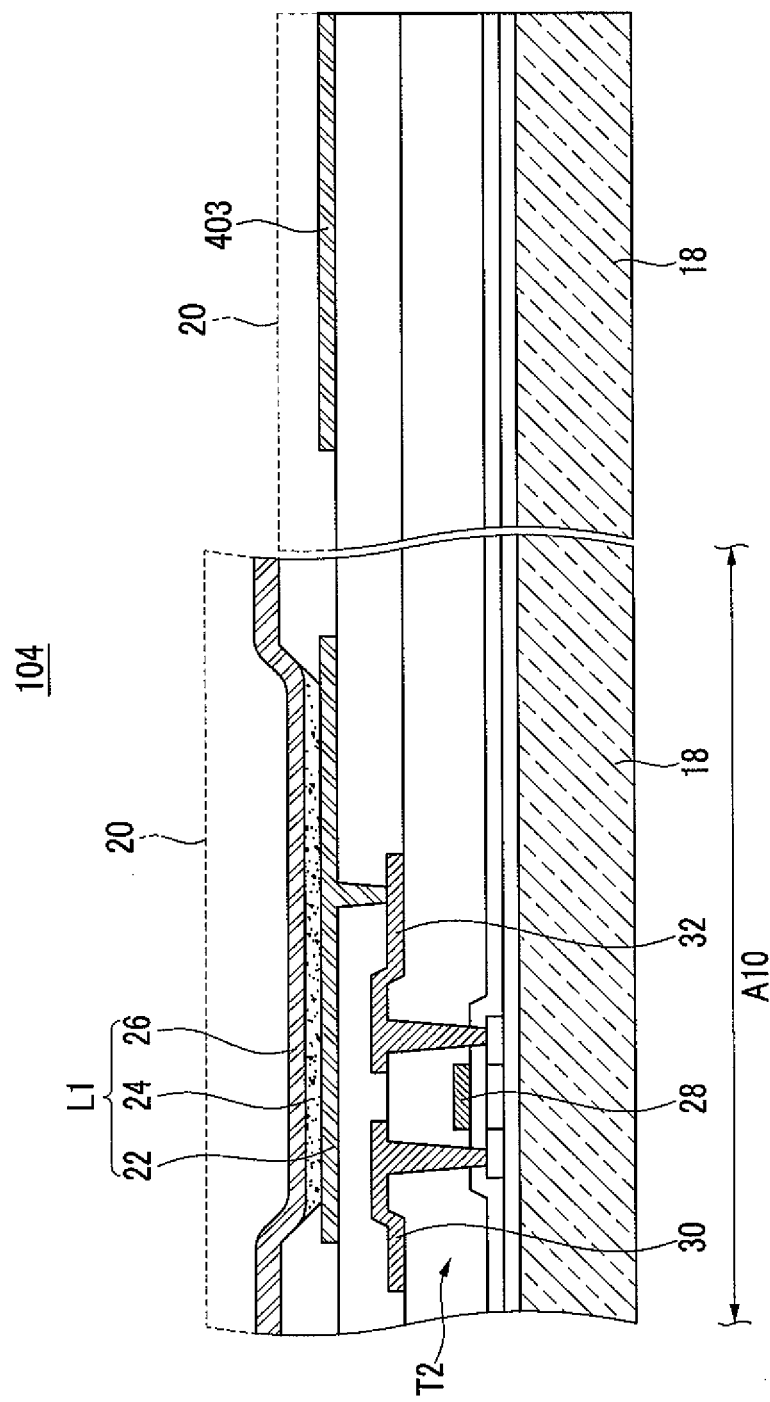
FIG. 8 is a partial amplified sectional view of an organic light emitting diode display according to a fourth exemplary embodiment.

FIG. 8 is a partial amplified sectional view of an organic light emitting diode display according to a fourth exemplary embodiment.

Referring to FIG. 8, an organic light emitting diode display 104 according to the present exemplary embodiment has the same structure as that of the organic light emitting diode display according to the first exemplary embodiment, except that a nonorganic layer 403 is formed on the same plane as the first pixel electrode 22 with the same material. Like reference numerals will be used to designate the same members as those related to the first exemplary embodiment.

If the organic light emitting diode display 104 is formed as a front emission type, the first pixel electrode 22 and the nonorganic layer 403 may be formed with a photo-reflective metallic layer, for example, Al, an Al alloy, Ag, an Ag alloy, Au, or an Au alloy. If the organic light emitting diode display 104 is formed as a rear emission type, the first pixel electrode 22 and the nonorganic layer 403 may be formed with a transparent conductive layer, for example, indium tin oxide (ITO), indium zinc oxide (IZO), ZnO, or $In_2O_3$.

Figure 9:
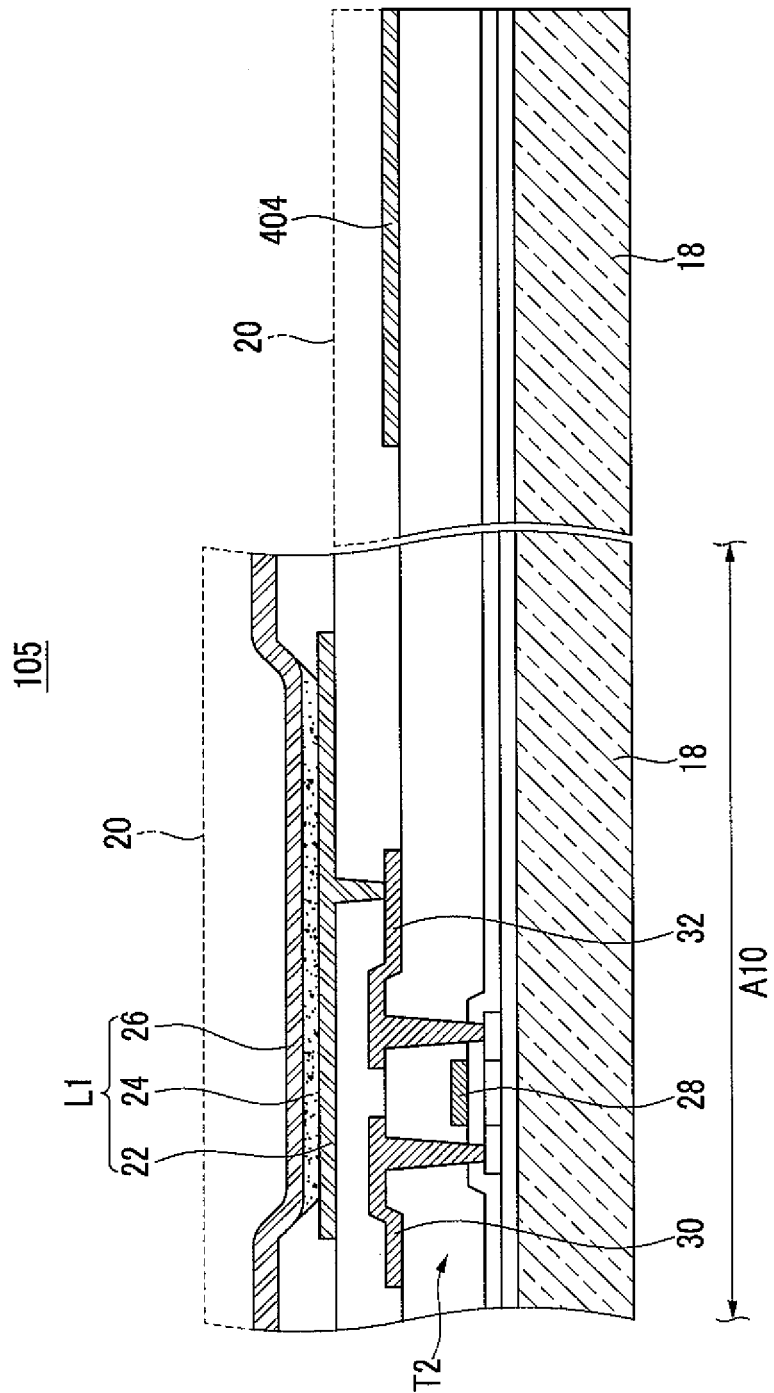
FIG. 9 is a partial amplified sectional view of an organic light emitting diode display according to a fifth exemplary embodiment.

FIG. 9 is a partial amplified sectional view of an organic light emitting diode display according to a fifth exemplary embodiment.

Referring to FIG. 9, an organic light emitting diode display 105 according to the present exemplary embodiment has the same structure as that of the organic light emitting diode display according to the first exemplary embodiment except that a nonorganic layer 404 is formed on the same plane as the source and the drain electrodes 30 and 32 of the driving transistor T2 with the same material. Like reference numerals will be used to designate the same members as those related to the first exemplary embodiment.

The source electrode 30, the drain electrode 32, and the nonorganic layer 404 may contain, for example, Ti, a Ti alloy, Ta, or a Ta alloy. The Ti-alloy may be for example TiN, and the Ta-alloy may be for example TaN.

Figure 10:
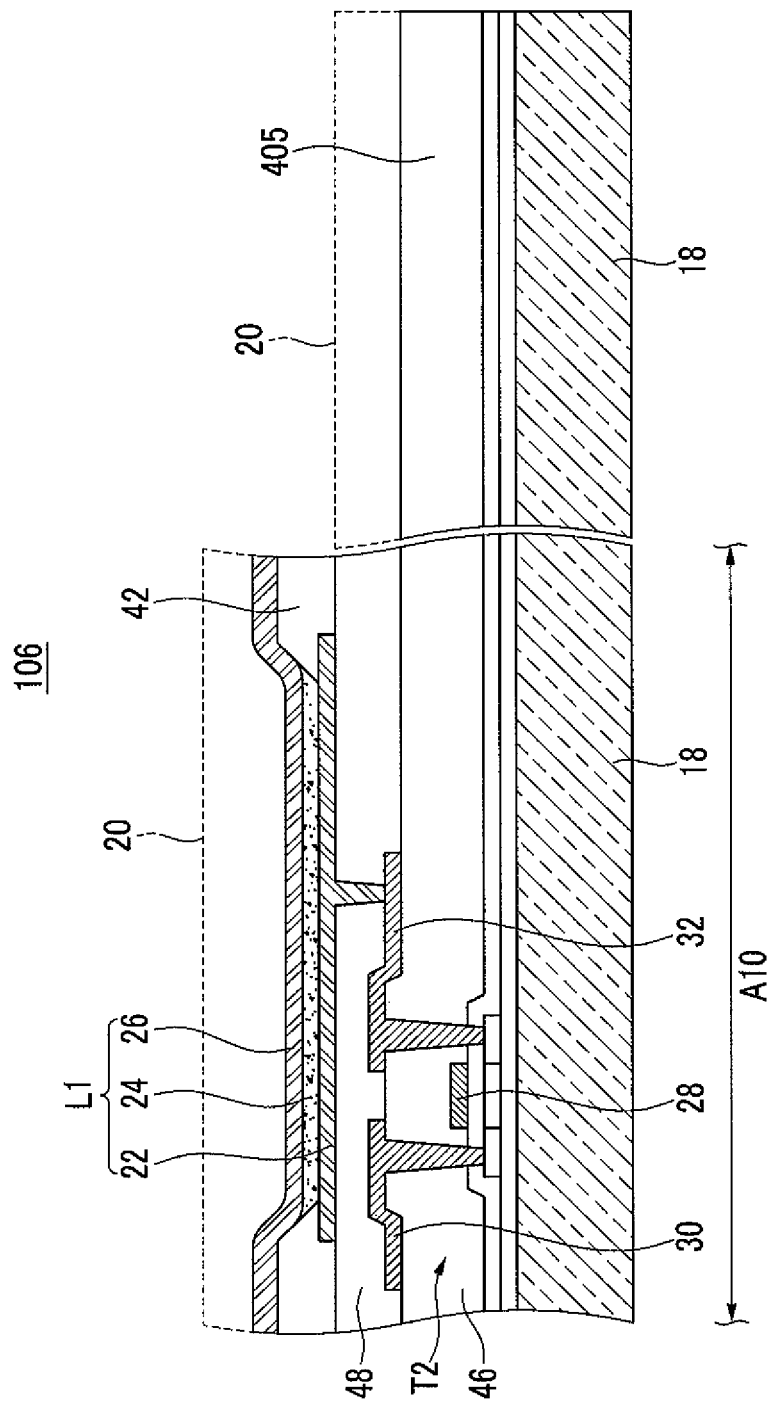
FIG. 10 is a partial amplified sectional view of an organic light emitting diode display according to a sixth exemplary embodiment.

FIG. 10 is a partial amplified sectional view of an organic light emitting diode display according to a sixth exemplary embodiment.

Referring to FIG. 10, an organic light emitting diode display 106 according to the present exemplary embodiment has the same structure as that of the organic light emitting diode display according to the first exemplary embodiment except that a nonorganic layer 405 is formed on the same plane as an interlayer insulating layer 46 with the same material. Like reference numerals will be used to designate the same members as those related to the first exemplary embodiment.

The interlayer insulating layer 46 is placed under the source and the drain electrodes 30 and 32 at the driving transistor T2 so as to insulate the source and the drain electrodes 30 and 32 from the gate electrode 28. The interlayer insulating layer 46 and the nonorganic layer 405 may be formed with a single-layered structure comprising silicon oxide or silicon nitride, or a double-layered structure comprising silicon oxide and silicon nitride.

The interlayer insulating layer 46 of the display area A10 is covered by a planarization layer 48 and a pixel definition layer 42. However, the interlayer insulating layer external to the display area A10 is not overlaid with any of the planarization layer and the pixel definition layer, or is overlaid with those layers and then exposed to the outside through removing those layers therefrom. With this process, the interlayer insulating layer external to the display area A10 is exposed to the outside so that it can be used as a nonorganic layer 405.

With the above-described second to sixth exemplary embodiments, as the nonorganic layer 401, 402, 403, 404, or 405 is formed on the same plane as any one of the plurality of layers constructing the display area A10, the nonorganic layer 401, 402, 403, 404, or 405 and the corresponding layer can be formed in a simultaneous manner so that the structure of the display and the processing steps thereof can be simplified.

While these embodiments have been described in connection with what is presently considered to be practical exemplary embodiments, it is to be understood that the embodiments are not limited to the disclosed embodiments, but, on the contrary, is intended to cover various modifications and equivalent arrangements included within the spirit and scope of the appended claims.

What is claimed is:

1. An organic light emitting diode display comprising:
   a substrate having organic light emitting diodes thereon;
   a thin film encapsulation layer formed on the substrate such that the thin film encapsulation layer covers the organic light emitting diodes; and
   a nonorganic layer formed under the thin film encapsulation layer and along the edge of the thin film encapsulation layer, wherein the entire surface of the nonorganic layer facing the thin film encapsulation layer directly contacts the thin film encapsulation layer,
   wherein the nonorganic layer covers only a region of the substrate without the organic light emitting diodes thereon, wherein the substrate comprises a display area with the organic light emitting diodes, wherein the nonorganic layer is placed external to and surrounds the display area, and wherein the nonorganic layer is formed on the same plane as any one of a plurality of layers constructing the display area with the same material.

2. The organic light emitting diode display of claim 1 further comprising a pixel definition layer placed external to the display area, wherein the nonorganic layer is formed on the pixel definition layer.

3. The organic light emitting diode display of claim 1, wherein the nonorganic layer comprises a layer selected from the group consisting of a metallic layer and an inorganic nonmetallic layer.

4. The organic light emitting diode display of claim 3, wherein the nonorganic layer comprises a material selected from the group consisting of Al, Cu, Mo, Ti, ITO, silicon oxide, silicon nitride, aluminum oxide, and silicon oxynitride.

5. The organic light emitting diode display of claim 1 further comprising an inorganic passivation layer covering the organic light emitting diodes, wherein the inorganic layer comprises the same material as the material for the inorganic passivation layer.

6. The organic light emitting diode display of claim 5, wherein the inorganic layer comprises a single-layered structure comprising silicon oxide or silicon nitride, or a double-layered structure comprising silicon oxide and silicon nitride.

7. The organic light emitting diode display of claim 1, wherein the organic light emitting diodes each comprise a first pixel electrode, an organic emissive layer, and a second pixel electrode, and the inorganic layer comprises the same material as the material for the second pixel electrode.

8. The organic light emitting diode display of claim 7, wherein the inorganic layer contains a material selected from the group consisting of ITO, IZO, ZnO, and $In_2O_3$.

9. The organic light emitting diode display of claim 7, wherein the inorganic layer contains a material selected from the group consisting of Al, an Al alloy, Ag, an Ag alloy, Au, and an Au alloy.

10. The organic light emitting diode display of claim 1, wherein the organic light emitting diodes each comprise a first pixel electrode, an organic emissive layer, and a second pixel electrode, and the inorganic layer comprises the same material as the material for the first pixel electrode.

11. The organic light emitting diode display of claim 10, wherein the inorganic layer comprises a material selected from the group consisting of Al, an Al alloy, Ag, an Ag alloy, Au, and an Au alloy.

12. The organic light emitting diode display of claim 10, wherein the inorganic layer comprises a material selected from the group consisting of ITO, IZO, ZnO, and $In_2O_3$.

13. The organic light emitting diode display of claim 1, further comprising driving transistors for driving the organic light emitting diodes, wherein the driving transistors each comprise a gate electrode, an interlayer insulating layer formed on the gate electrode, and source and drain electrodes formed on the interlayer insulating layer; and wherein the inorganic layer comprises the same material as the material for the source and drain electrodes.

14. The organic light emitting diode display of claim 13, wherein the inorganic layer comprises a material selected from the group consisting of Ti, a Ti alloy, Ta, and a Ta alloy.

15. The organic light emitting diode display of claim 14, wherein the Ti-alloy is TiN.

16. The organic light emitting diode display of claim 14, wherein the Ta-alloy is TaN.

17. The organic light emitting diode display of claim 1 further comprising driving transistors for driving the organic light emitting diodes, wherein the driving transistors each comprise a gate electrode, an interlayer insulating layer formed on the gate electrode, and source and drain electrodes formed on the interlayer insulating layer; and wherein the inorganic layer comprises the same material as the material for the interlayer insulating layer.

18. The organic light emitting diode display of claim 17, wherein the nonorganic layer is formed with a single-layered structure comprising silicon oxide or silicon nitride, or a double-layered structure comprising silicon oxide and silicon nitride.

* * * * *